United States Patent
Wahlberg et al.

(10) Patent No.: US 10,320,353 B1
(45) Date of Patent: Jun. 11, 2019

(54) AUTOMATED PAUSE OF MEDIA CONTENT PLAYBACK BASED ON SOUND LEVEL

(71) Applicant: Spotify AB, Stockholm (SE)

(72) Inventors: Jimmy Wahlberg, Uppsala (SE); Thorbiörn Fritzon, Upplands Väsby (SE)

(73) Assignee: SPOTIFY AB, Stockholm (SE)

( * ) Notice: Subject to any disclaimer, the term of this patent is extended or adjusted under 35 U.S.C. 154(b) by 0 days.

(21) Appl. No.: 15/972,778

(22) Filed: May 7, 2018

(51) Int. Cl.
| H03G 3/00 | (2006.01) |
| H03G 3/32 | (2006.01) |
| G06F 3/16 | (2006.01) |
| H04R 1/40 | (2006.01) |
| H04R 5/02 | (2006.01) |

(52) U.S. Cl.
CPC .............. *H03G 3/32* (2013.01); *G06F 3/165* (2013.01); *H04R 1/406* (2013.01); *H04R 5/02* (2013.01); *H04R 2499/13* (2013.01)

(58) Field of Classification Search
CPC ...... H03G 3/32; H04R 1/406; H04R 2499/13; H04R 5/02; G06F 3/165
See application file for complete search history.

(56) References Cited

U.S. PATENT DOCUMENTS

| 5,081,682 A | * | 1/1992 | Kato | ........................ | H03G 3/32 |
| | | | | | 381/108 |
| 6,529,605 B1 | * | 3/2003 | Christoph | ................ | H03G 3/32 |
| | | | | | 381/56 |
| 8,116,461 B2 | * | 2/2012 | L'Esperance et al. | ... | H04S 7/00 |
| | | | | | 381/102 |
| 9,781,537 B2 | * | 10/2017 | Smith | ..................... | H04S 7/301 |
| 2009/0138507 A1 | | 5/2009 | Burckart et al. | | |
| 2013/0079908 A1 | | 3/2013 | Wu | | |
| 2016/0360019 A1 | | 12/2016 | Ellis | | |

* cited by examiner

*Primary Examiner* — Andrew L Sniezek
(74) *Attorney, Agent, or Firm* — Merchant & Gould P.C.

(57) ABSTRACT

An example system for playing media content with a media playback device in a vehicle can be programmed to obtain a sound measurement indicative of a sound level associated with playback of the media content by the media playback device in the vehicle. The example system also can determine a deviation in an expected sound level based upon the sound measurement. Finally, the system can modify playback of the media content by the media playback device (110) based upon the deviation.

12 Claims, 9 Drawing Sheets

AUTOMATED PAUSE OF MEDIA CONTENT PLAYBACK BASED ON SOUND LEVEL

BACKGROUND

Many people enjoy consuming media content while travelling or during other activities. For example, many drivers and passengers listen to audio content, such as songs, albums, podcasts, audiobooks, and other types of audible content, in vehicles. Typical sources of such audio content in vehicles include radios and fixed media players, such as devices that can play media content from CDs, USB drives, or SD cards. Media content from such typical sources is not flexible or personalized for the listeners in vehicles.

Alternatively, mobile devices, such as mobile phones or tablets running audio streaming applications, can offer a personalized and flexible music-consuming experience using large catalogs of media content available from a media content server. However, mobile devices are not well suited for a vehicle environment for various reasons, such as legal restrictions and sophisticated user interfaces that are not convenient for use in a vehicle.

There exists a need for a media playback system that is easy to use and control for media content playback while providing personalized user experience of consuming media content in a vehicle.

SUMMARY

In general terms, the present disclosure relates to playing media content with a media playback device in a vehicle. In one possible configuration and by non-limiting example, a sound level in the vehicle can be measured. Based on that sound level, the playback of the media content can be modified (e.g., paused). Various aspects are described in this disclosure, which include, but are not limited to, the following aspects.

One aspect is an example method for playing media content with a media playback device (110) in a vehicle (102), the method including: obtaining (810) a sound measurement indicative of a sound level associated with playback of the media content by the media playback device (110) in the vehicle (102); determining (830) a deviation in an expected sound level based upon the sound measurement; and modifying (840) playback of the media content by the media playback device (110) based upon the deviation.

Another aspect is an example system for playing media content with a media playback device (110) in a vehicle (102), the system including: at least one processor (148); and memory (150) encoding instructions that, when executed by the at least one processor, causes the at least one processor to: obtain a sound measurement indicative of a sound level associated with playback of the media content by the media playback device (110) in the vehicle (102); determine a deviation in an expected sound level based upon the sound measurement; and modify playback of the media content by the media playback device (110) based upon the deviation.

DETAILED DESCRIPTION

Figure 1:
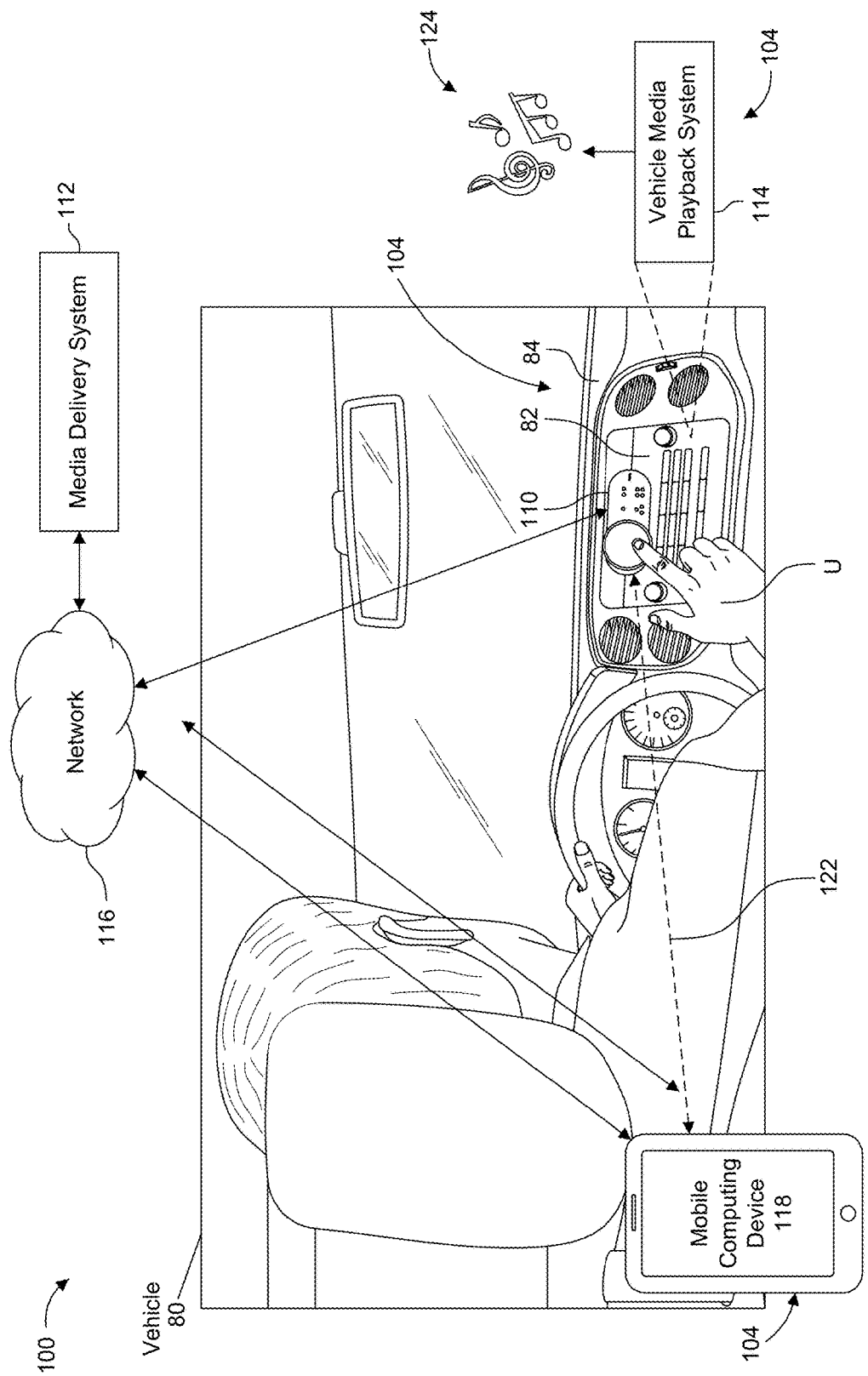
FIG. 1 illustrates an example system for streaming media content for playback.

Various embodiments will be described in detail with reference to the drawings, wherein like reference numerals represent like parts and assemblies throughout the several views.

People spend a significant amount of time travelling in vehicles. Many of them find that time to be more enjoyable when they are listening to music, watching videos, or otherwise consuming media content. Media content includes audio and video content. Examples of audio content include songs, albums, playlists, radio stations, podcasts, audiobooks, and other audible media content items. Examples of video content include movies, music videos, television programs, and other visible media content items. In many cases, video content also includes audio content. As used herein, the term "vehicle" can be any machine that is operable to transport people or cargo. Vehicles can be motorized or non-motorized. Vehicles can be for public or private transport. Examples of vehicles include motor vehicles (e.g., cars, trucks, buses, motorcycles), rail vehicles (e.g., trains, trams), tracked vehicles, watercraft (e.g., ships, boats), aircraft, human-powered vehicles (e.g., bicycles), wagons, and other transportation means. A user can drive a vehicle or ride in as a passenger for travelling. As used herein, the term "travel" and variants thereof refers to any activity in which a user is in transit between two locations.

Consuming media content in a vehicle presents many challenges. In general, a user in a moving vehicle may have limited attention available for interacting with a media playback device due to the need to concentrate on travel related activities, such as driving and navigation. Therefore, while a vehicle is moving, it can be difficult for a user in the vehicle to interact with a media playback device without disrupting the driving or navigation. Further, the user interface of a media playback device can be overly complex, or may require such fine motor skills that it can be difficult to use while traveling in a vehicle. Voice-based user interfaces also encounter significant challenges to use in a vehicle environment. The passenger areas of a vehicle are often noisy due to engine noise, road noise, wind and weather noises, passenger noises, and the sound of any media content that may be playing on a media playback system in the vehicle. This noise hampers the ability of the voice-based user interface to interact with a user. Moreover, accessing media content while travelling may be difficult, expensive, or impossible depending on network availability or capacity along the route of travel. Further, accessing and playing media content can require significant amounts of electric power. Thus, use of a mobile device for media content playback during travel may be undesirable because it will drain the battery. It can also be challenging to connect a media playback device to a vehicle's built-in audio system because of the requirement to connect to auxiliary cables or undergo a complicated wireless pairing process. Embodiments disclosed herein address some or all of these challenges. It should be understood, however, that various aspects described herein are not limited to use of a media playback device during travel.

On the other hands, many users desire a personalized media consuming experience. For example, a user can access almost limitless catalogs of media content through various free or fee-based media delivery services, such as media streaming services. Users can use mobile devices or other media playback devices to access large catalogs of media content. Due to such large collections of media content, it is desired to make it possible to customize a selection of media content to match users' individual tastes and preferences so that users can consume their favorite media content while traveling in a vehicle.

Many vehicles include a built-in media playback device, such as a radio or a fixed media player, such as a player that can play media content from a CD, USB driver, or SD cards. However, the media content that is delivered using these built in vehicle media playback devices is greatly limited and is not flexible or customizable to the user.

Alternatively, a mobile device, such as a smartphone or a tablet, can be used by a user to enjoy personalized and flexible music consuming experience in a vehicle by running music streaming applications thereon. However, mobile devices are not well suited for use in a vehicle environment for various reasons. For example, mobile devices are not readily accessible or controllable while driving or navigating. Further, connection between a mobile device and a vehicle audio system is often inconvenient and unreliable. Moreover, the music streaming application is not automatically ready to run and play media content, and the user needs to pick up the mobile device and open the music streaming application and control a sophisticated user interface to play media content. Additionally, many users have limited mobile data available via their mobile devices and are concerned about data usage while using the music streaming application in the vehicle. Battery drainage and legal restrictions on use while driving are further drawbacks to using mobile devices for playing media content in the vehicle.

To address these challenges, the present disclosure provides a special-purpose personal appliance that can be used for streaming media in a vehicle. The appliance is also referred to herein as the personal media streaming appliance (PMSA). In some embodiments, the appliance is specially designed to be dedicated for media streaming purposes in a vehicle, and there is no other general use. Some embodiments of the appliance can operate to communicate directly with a media content server and receive streamed media content from the server via a cellular network. In these embodiments, other computing devices, such mobile devices, are not involved in this direct communication between the appliance and the media content server. Mobile data cost can be included in the subscription of the media streaming service or a purchase price of the personal appliance. Therefore, the customer's possible concern about mobile data usage can be eliminated. In other embodiments, the appliance can connect to another computing device, such as a mobile device, that provides a mobile hotspot to enable the appliance to communicate with the media content server rather than the appliance communicating with it directly. For example, a mobile device is used to assist in communication between the appliance and the media content server.

Further, the appliance can be associated with a user account of the user for the media streaming service so that the user can enjoy personalized media content.

In some embodiments, the appliance provides a simplified user interface so that a user can easily control playback of media content in a vehicle while maintaining his or her focus on other tasks such as driving or navigating. For example, the appliance has a limited set of physical control elements that are intuitively controllable for playback of media content with little (often only one) input from a user. Examples of such physical control elements include a rotatable knob and one or more physically-depressible buttons.

Further, in some embodiments, the appliance is configured to be easily mounted to an interior structure of a vehicle, such as a dashboard, so that the user can easily reach the appliance.

In some embodiments, the appliance also provides an output interface that can be easily connected to a vehicle audio system, such as via an auxiliary input port or Bluetooth. Therefore, the media content streamed to the appliance can then be transmitted from the appliance to the vehicle audio system for playback in the vehicle.

In some embodiments, the appliance can includes a voice interaction system designed for voice interaction with a user in the noisy environment of a vehicle. In some embodiments, the appliance includes multiple microphones that reduce the effects of ambient noise in the passenger area of the vehicle. In an example, the appliance includes at least three microphones: two directed to the passenger area of the vehicle and another facing away from the passenger area of the vehicle to pick up vibrations and low frequency noise for cancellation. The appliance also applies spectral noise cancellation to reduce non-voice frequencies. In addition, omni-directional noise cancellation is applied in some embodiments to reduce omni-directional sound (e.g., vehicle noise). Directional noise is detected by determining a difference between audio input detected by the two microphones facing the passenger area. The difference is preserved as directional audio input. The appliance further cancels out audio that it is currently playing, allowing the appliance to detect voice commands even over loud music, for instance. In this manner, the appliance is arranged to provide an improved voice-based interface in a vehicle environment.

Embodiments described herein are directed to playing media content with a media playback device in a vehicle. In these examples, a sound level in the vehicle can be measured. Based on that sound level, the playback of the media content can be modified (e.g., paused). See FIGS. 7-9 for additional details.

As described herein, consuming media content may include one or more of listening to audio content, watching video content, or consuming other types of media content. For ease of explanation, the embodiments described in this application are presented using specific examples. For example, audio content (and in particular music) is described as an example of one form of media consumption. As another example, a vehicle is described as an example of an environment in which media content is consumed. Further, traveling (and in particular driving) in a vehicle is described as an example of an activity during which media content is consumed. However, it should be understood that the same concepts are similarly applicable to other forms of media consumption and to other environments or activities, and at least some embodiments include other forms of media consumption and/or are configured for use in other environments or during other activities.

FIG. 1 illustrates an example system 100 for streaming media content for playback. The system 100 can be used in a vehicle 80. The vehicle 80 includes a dashboard 82 or a head unit 84. The system 100 includes one or more media playback devices 104 configured to play media content, such as a personal media streaming appliance (PMSA) system 110, a media delivery system 112, a vehicle media playback system 114, and a mobile computing device 118. The system 100 further includes a data communication network 116 and an in-vehicle wireless data communication network 122.

The PMSA system 110 operates to receive media content that is provided (e.g., streamed, transmitted, etc.) by a system external to the PMSA system 110, such as the media delivery system 112, and transmit the media content to the vehicle media playback system 114 for playback. In some embodiments, the PMSA system 110 is a portable device which can be carried into and used in the vehicle 80. The PMSA system 110 can be mounted to a structure of the vehicle 80, such as the dashboard 82 or the head unit 84. In other embodiments, the PMSA system 110 can be configured to be built in a structure of the vehicle 80. An example of the PMSA system 110 is illustrated and described in more detail with reference to FIGS. 2 and 6.

The media delivery system 112 operates to provide media content to one or more media playback devices 104 via the network 116. In the illustrated example, the media delivery system 112 provides media content to the PMSA system 110 for playback of media content using the vehicle media playback system 114. An example of the media delivery system 112 is illustrated and described in further detail herein, such as with reference to FIG. 3.

The vehicle media playback system 114 operates to receive media content from the PMSA system 110 and generates a media output 124 to play the media content in the vehicle 80. An example of the vehicle media playback system 114 is illustrated and described in further detail herein, such as with reference to FIG. 4.

The network 116 is a data communication network that facilitates data communication between the PMSA system 110 and the media delivery system 112. In some embodiments, the mobile computing device 118 can also communicate with the media delivery system 112 across the network 116. The network 116 typically includes a set of computing devices and communication links between the computing devices. The computing devices in the network 116 use the links to enable communication among the computing devices in the network. The network 116 can include one or more routers, switches, mobile access points, bridges, hubs, intrusion detection devices, storage devices, standalone server devices, blade server devices, sensors, desktop computers, firewall devices, laptop computers, handheld computers, mobile telephones, vehicular computing devices, and other types of computing devices.

In various embodiments, the network 116 includes various types of communication links. For example, the network 116 can include wired and/or wireless links, including cellular, Bluetooth, ultra-wideband (UWB), 802.11, ZigBee, and other types of wireless links. Furthermore, in various embodiments, the network 116 is implemented at various scales. For example, the network 116 can be implemented as one or more vehicle area networks, local area networks (LANs), metropolitan area networks, subnets, wide area networks (WAN) (such as the Internet), or can be implemented at another scale. Further, in some embodiments, the network 116 includes multiple networks, which may be of the same type or of multiple different types.

In some embodiments, the network 116 can also be used for data communication between other media playback devices 104 (e.g., the mobile computing device 118) and the media delivery system 112. Because the network 116 is configured primarily for data communication between computing devices in the vehicle 80 and computing devices outside the vehicle 80, the network 116 is also referred to herein as an out-of-vehicle network for out-of-vehicle data communication.

Unlike the network 116, the in-vehicle wireless data communication 122 can be used for direct data communication between computing devices (e.g., the media playback devices 104) in the vehicle 80. In some embodiments, the in-vehicle wireless data communication 122 is used for direct communication between the PMSA system 110 and the mobile computing device 118. In other embodiments, the mobile computing device 118 can communicate with the PMSA system 110 in the data communication network 116. In some embodiments, the in-vehicle wireless data communication 122 can also be used for data communication between the PMSA system 110 and the vehicle media playback system 114.

Various types of wireless communication interfaces can be used for the in-vehicle wireless data communication 122. In some embodiments, the in-vehicle wireless data communication 122 includes Bluetooth® technology. In other embodiments, the in-vehicle wireless data communication 122 includes WiFi® technology. In yet other embodiments, other suitable wireless communication interfaces can be used for the in-vehicle wireless data communication 122, such as near field communication (NFC) and a ultrasonic data transmission.

In some embodiments, the mobile computing device 118 is configured to play media content independently from the PMSA system 110. In some embodiments, the mobile computing device 118 is a standalone computing device that, without the PMSA system 110 involved, can communicate with the media delivery system 112 and receive media content from the media delivery system 112 for playback in the vehicle 80. An example of the mobile computing device 118 is illustrated and described in further detail herein, such as with reference to FIG. 5.

Figure 2:
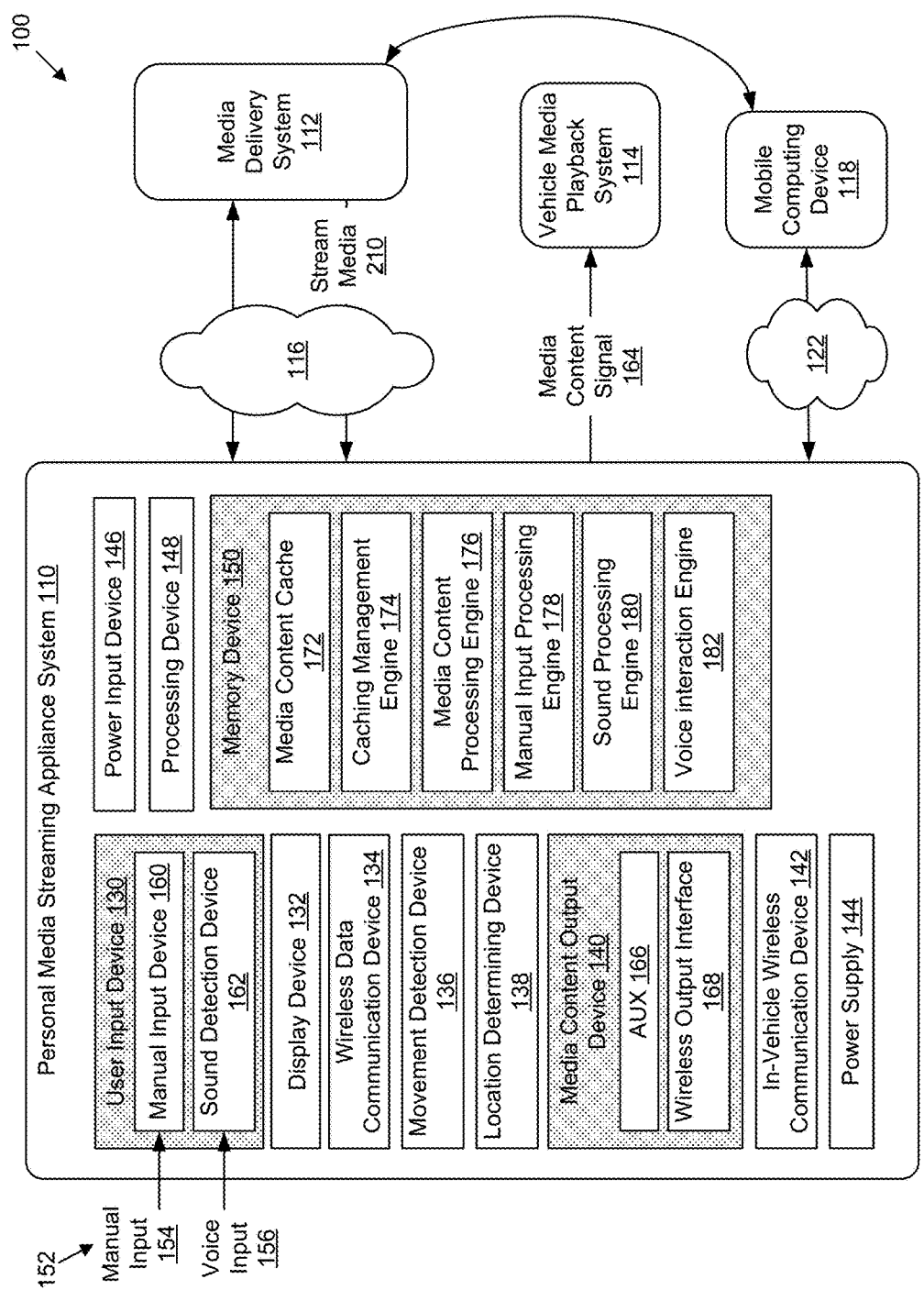
FIG. 2 is a block diagram of an example embodiment of a personal media streaming appliance (PMSA) system.

FIG. 2 is a block diagram of an example embodiment of the PMSA system 110 of the media streaming system 100 shown in FIG. 1. In this example, the PMSA system 110 includes a user input device 130, a display device 132, a wireless data communication device 134, a movement detection device 136, a location determining device 138, a media content output device 140, an in-vehicle wireless communication device 142, a power supply 144, a power input device 146, a processing device 148, and a memory device 150.

In some embodiments, the PMSA system 110 is a system dedicated for streaming personalized media content in a vehicle environment. At least some embodiments of the PMSA system 110 have limited functionalities specifically selected for streaming media content from the media delivery system 112 at least via the network 116 and/or for providing other services associated with the media content streaming service. The PMSA system 110 may have no other general use such as found in other computing devices, such as smartphones, tablets, and other smart devices. For example, in some embodiments, when the PMSA system 110 is powered up, the PMSA system 110 is configured to automatically activate a software application that is configured to perform the media content streaming and media playback operations of the PMSA system 110 using at least one of the components, devices, and elements of the PMSA system 110. In some embodiments, the software application of the PMSA system 110 is configured to continue running until the PMSA system 110 is powered off or powered down to a predetermined level. In some embodiments, the PMSA system 110 is configured to be free of any user interface control that would allow a user to disable the automatic activation of the software application on the PMSA system 110.

As described herein, the PMSA system 110 provides various structures, features, and functions that improve the user experience of consuming media content in a vehicle.

As illustrated, the PMSA system 110 can communicate with the media delivery system 112 to receive media content via the network 116 and enable the vehicle media playback system 114 to play the media content in the vehicle. In some embodiments, the PMSA system 110 can communicate with the mobile computing device 118 that is in data communication with the media delivery system 112. As described herein, the mobile computing device 118 can communicate with the media delivery system 112 via the network 116.

The user input device 130 operates to receive a user input 152 from a user U for controlling the PMSA system 110. As illustrated, the user input 152 can include a manual input 154 and a voice input 156. In some embodiments, the user input device 130 includes a manual input device 160 and a sound detection device 162.

The manual input device 160 operates to receive the manual input 154 for controlling playback of media content via the PMSA system 110. In addition, in some embodiments, the manual input 154 is received for managing various pieces of information transmitted via the PMSA system 110 and/or controlling other functions or aspects associated with the PMSA system 110.

In some embodiments, the manual input device 160 includes one or more manual control elements configured to receive various manual control actions, such as pressing actions and rotational actions. As described herein, the physical input device 160 includes a manual control knob 510 and one or more physical buttons 512, which is further illustrated and described with reference to FIG. 6.

The sound detection device 162 operates to detect and record sounds from proximate the PMSA system 110. For example, the sound detection device 162 can detect sounds including the voice input 156. In some embodiments, the sound detection device 162 includes one or more acoustic sensors configured to detect sounds proximate the PMSA system 110. For example, acoustic sensors of the sound detection device 162 includes one or more microphones. Various types of microphones can be used for the sound detection device 162 of the PMSA system 110.

In some embodiments, the voice input 156 is a user's voice (also referred to herein as an utterance) for controlling playback of media content via the PMSA system 110. In addition, the voice input 156 is a user's voice for managing various data transmitted via the PMSA system 110 and/or controlling other functions or aspects associated with the PMSA system 110.

In some embodiments, the sound detection device 162 is configured to cancel noises from the received sounds so that a desired sound (e.g., the voice input 156) is clearly identified. For example, the sound detection device 162 can include one or more noise-canceling microphones which are configured to filter ambient noise from the voice input 156. In addition or alternatively, a plurality of microphones of the sound detection device 162 are arranged at different locations in a body of the PMSA system 110 and/or oriented in different directions with respect to the body of the PMSA system 110, so that ambient noise is effectively canceled from the voice input 156 or other desired sounds being identified.

In some embodiments, the sounds detected by the sound detection device 162 can be processed by the sound processing engine 180 of the PMSA system 110 as described below.

Referring still to FIG. 2, the display device 132 operates to display information to the user U. Examples of such information include media content playback information, notifications, and other information.

In some embodiments, the display device 132 operates as a display screen only and is not capable of receiving a user input. By receiving the manual input 154 only via the manual input device 160 and disabling receipt of manual input via the display device 132, the user interface of the PMSA system 110 is simplified so that the user U can control the PMSA system 110 while maintaining focus on other activities in the vehicle 80. It is understood however that, in other embodiments, the display device 132 is configured as a touch-sensitive display screen that operates as both a display screen and a user input device. In yet other embodiments, the PMSA system 110 does not include a display device.

As described herein, in some embodiments, the display device 132 is arranged at the manual input device 160. In other embodiments, the display device 132 is arranged separate from the manual input device 160.

The wireless data communication device 134 operates to enable the PMSA system 110 to communicate with one or more computing devices at a remote location that is outside the vehicle 80. In the illustrated example, the wireless data communication device 134 operates to connect the PMSA system 110 to one or more networks outside the vehicle 80, such as the network 116. For example, the wireless data communication device 134 is configured to communicate with the media delivery system 112 and receive media content from the media delivery system 112 at least partially via the network 116. The wireless data communication device 134 can be a wireless network interface of various types which connects the PMSA system 110 to the network 116. Examples of the wireless data communication device 134 include wireless wide area network (WWAN) interfaces, which use mobile telecommunication cellular network technologies. Examples of cellular network technologies include LTE, WiMAX, UMTS, CDMA2000, GSM, cellular digital packet data (CDPD), and Mobitex. In the some embodiments, the wireless data communication device 134 is configured as a cellular network interface to facilitate data communication between the PMSA system 110 and the media delivery system 112 over cellular network.

The movement detection device 136 can be used to detect movement of the PMSA system 110 and the vehicle 80. In some embodiments, the movement detection device 136 is configured to monitor one or more factors that are used to determine movement of the vehicle 80. The movement detection device 136 can include one or more sensors that are configured to detect movement, position, and/or orientation of the PMSA system 110. As an example, the movement detection device 136 is operable to determine an orientation of the PMSA system 110. The movement detection device 136 can detect changes in the determined orientation and interpret those changes as indicating movement of the PMSA system 110. In some embodiments, the movement detection device 136 includes an accelerometer. In other embodiments, the movement detection device 136 includes a gyroscope. Other sensors can also be used for the movement detection device 136, such as a magnetometer, a GPS receiver, an altimeter, an odometer, a speedometer, a shock detector, a vibration sensor, a proximity sensor, and an optical sensor (e.g., a light sensor, a camera, and an infrared sensor).

The location determining device 138 is a device that determines the location of the PMSA system 110. In some embodiments, the location determining device 138 uses one or more of Global Positioning System (GPS) technology (which may receive GPS signals), Global Navigation Satellite System (GLONASS), cellular triangulation technology, network-based location identification technology, Wi-Fi positioning systems technology, and combinations thereof.

The media content output device 140 is an interface that enables the PMSA system 110 to transmit media content to the vehicle media playback device 114. Some embodiments of the PMSA system 110 do not have a speaker and thus cannot play media content independently. In these embodiments, the PMSA system 110 is not regarded as a standalone device for playing media content. Instead, the PMSA system 110 transmits media content to another media playback device, such as the vehicle media playback device 114 to enable the other media playback device to play the media content, such as through the vehicle stereo system.

As illustrated, the PMSA system 110 (e.g., a media content processing engine 176 thereof in FIG. 2) can convert media content to a media content signal 164, the media content output device 140 transmits the media content signal 164 to the vehicle media playback system 114. The vehicle media playback system 114 can play the media content based on the media content signal 164. For example, the vehicle media playback system 114 operates to convert the media content signal 164 into a format that is readable by the vehicle media playback system 114 for playback.

In some embodiments, the media content output device 140 includes an auxiliary (AUX) output interface 166 and a wireless output interface 168.

Figure 6:
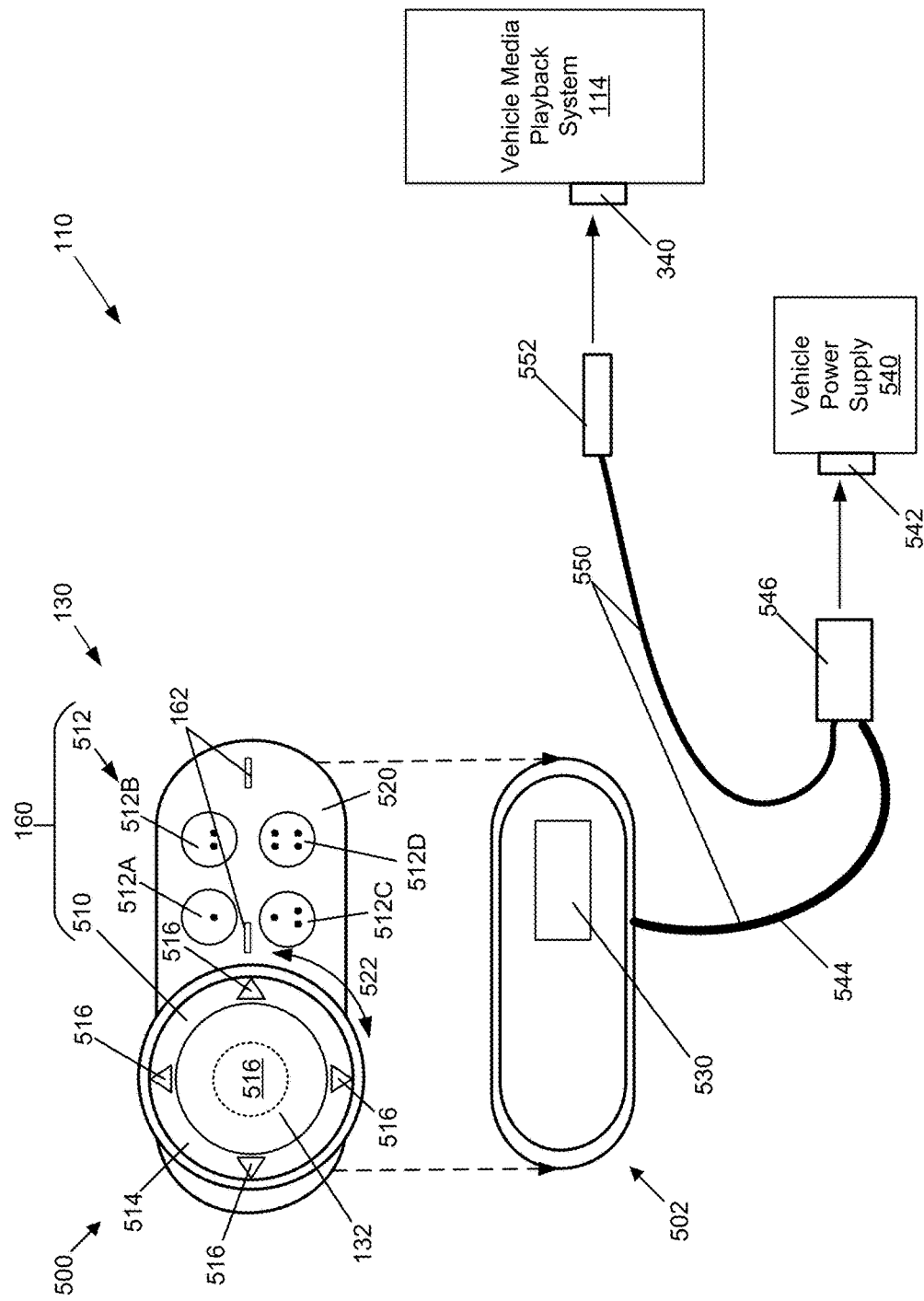
FIG. 6 schematically illustrates an example embodiment of the PMSA system.

The AUX output interface 166 is configured to connect the PMSA system 110 to the vehicle media playback system 114 via a cable (e.g., a media content output line 550 in FIG. 6) of the PMSA system 110. In some embodiments, as illustrated in FIG. 6, the media content output line 550 extending from the PMSA system 110 is connected to an input connector 340 (e.g., an auxiliary input jack or port) of the vehicle media playback system 114. As illustrated herein, the media content output line 550 can be of various types, such as an analog audio cable or a USB cable.

The wireless output interface 168 is configured to connect the PMSA system 110 to the vehicle media playback system 114 via a wireless communication protocol. In some embodiments, the wireless output interface 168 is configured for Bluetooth connection. In other embodiments, the wireless output interface 168 is configured for other types of wireless connection. In some embodiments, the wireless output interface 168 is incorporated into, or implemented with, the in-vehicle wireless communication device 142. For example, when the media content output device 140 wirelessly transmits media content to the vehicle media playback system 114, the in-vehicle wireless communication device 142 can be used to implement the wireless output interface 168 of the media content output device 140.

Referring still to FIG. 2, the in-vehicle wireless communication device 142 operates to establish a wireless data communication, such as the in-vehicle wireless data communication 122, between computing devices in a vehicle 80. In the illustrated example, the in-vehicle wireless communication device 142 is used to enable the PMSA system 110 to communicate with other computing devices, such as the mobile computing device 118, in the vehicle 80. Various types of wireless communication interfaces can be used for the in-vehicle wireless communication device 142, such as Bluetooth Technology®, WiFi® technology, a near field communication (NFC), and an ultrasound data transmission. The in-vehicle wireless communication is also referred to herein as a short-range wireless communication.

The power supply 144 is included in the example PMSA system 110 and is configured to supply electric power to the PMSA system 110. In some embodiments, the power supply 144 includes at least one battery. The power supply 144 can be rechargeable. For example, the power supply 144 can be recharged using the power input device 146 that is connected to an external power supply. In some embodiments, the power supply 144 is included inside the PMSA system 110 and is not removable from the PMSA system 110. In other embodiments, the power supply 144 is removable by the user from the PMSA system 110.

The power input device 146 is configured to receive electric power to maintain activation of components of the PMSA system 110. As described herein, the power input device 146 is connected to a power source of the vehicle 80 (e.g., a vehicle power supply 540 in FIG. 6) and use the electric power from the vehicle 80 as a primary power source to maintain activation of the PMSA system 110 over an extended period of time, such as longer than several minutes.

The processing device 148, in some embodiments, comprises one or more central processing units (CPU). In other embodiments, the processing device 148 additionally or alternatively includes one or more digital signal processors, field-programmable gate arrays, or other electronic circuits.

The memory device 150 typically includes at least some form of computer-readable media. Computer readable media includes any available media that can be accessed by the PMSA system 110. By way of example, computer-readable media include computer readable storage media and computer readable communication media.

Computer readable storage media includes volatile and nonvolatile, removable and non-removable media implemented in any device configured to store information such as computer readable instructions, data structures, program modules, or other data. Computer readable storage media includes, but is not limited to, random access memory, read only memory, electrically erasable programmable read only memory, flash memory and other memory technology, compact disc read only memory, blue ray discs, digital versatile discs or other optical storage, magnetic storage devices, or any other medium that can be used to store the desired information and that can be accessed by the PMSA system 110. In some embodiments, computer readable storage media is non-transitory computer readable storage media.

Computer readable communication media typically embodies computer readable instructions, data structures, program modules or other data in a modulated data signal such as a carrier wave or other transport mechanism and includes any information delivery media. The term "modulated data signal" refers to a signal that has one or more of its characteristics set or changed in such a manner as to encode information in the signal. By way of example, computer readable communication media includes wired media such as a wired network or direct-wired connection, and wireless media such as acoustic, radio frequency, infrared, and other wireless media. Combinations of any of the above are also included within the scope of computer readable media.

The memory device 150 operates to store data and instructions. In some embodiments, the memory device 150 stores instructions for a media content cache 172, a caching management engine 174, a media content processing engine 176, a manual input processing engine 178, a sound processing engine 180, and a voice interaction engine 182.

Some embodiments of the memory device 150 include the media content cache 172. The media content cache 172 stores media content items, such as media content items that have been received from the media delivery system 112. The media content items stored in the media content cache 172 may be stored in an encrypted or unencrypted format. In some embodiments, the media content cache 172 also stores metadata about media content items such as title, artist name, album name, length, genre, mood, era, etc. The media content cache 172 can further store playback information about the media content items and/or other information associated with the media content items.

The caching management engine 174 is configured to receive and cache media content in the media content cache 172 and manage the media content stored in the media content cache 172. In some embodiments, when media content is streamed from the media delivery system 112, the caching management engine 174 operates to cache at least a portion of the media content into the media content cache 172 so that at least a portion of the cached media content can be transmitted to the vehicle media playback system 114 for playback. In other embodiments, the caching management engine 174 operates to cache at least a portion of media content into the media content cache 172 while online so that the cached media content is retrieved for playback while the PMSA system 110 is offline.

The media content processing engine 176 is configured to process the media content that is received from the media delivery system 112, and generate the media content signal 164 usable for the vehicle media playback system 114 to play the media content. The media content signal 164 is transmitted to the vehicle media playback system 114 using the media content output device 140, and then decoded so that the vehicle media playback system 114 plays the media content in the vehicle 80.

The manual input processing engine 178 operates to receive the manual input 154 via the manual input device 160. In some embodiments, when the manual input device 160 is actuated (e.g., pressed or rotated) upon receiving the manual input 154, the manual input device 160 generates an electric signal representative of the manual input 154. The manual input processing engine 178 can process the electric signal and determine the user input (e.g., command or instruction) corresponding to the manual input 154 to the PMSA system 110. In some embodiments, the manual input processing engine 178 can perform a function requested by the manual input 154, such as controlling playback of media content. The manual input processing engine 178 can cause one or more other engines to perform the function associated with the manual input 154.

The sound processing engine 180 is configured to receive sound signals obtained from the sound detection device 162 and process the sound signals to identify different sources of the sounds received via the sound detection device 162. In some embodiments, the sound processing engine 180 operates to filter the user's voice input 156 from noises included in the detected sounds. Various noise cancellation technologies, such as active noise control or cancelling technologies or passive noise control or cancelling technologies, can be used for filter the voice input from ambient noise. In examples, the sound processing engine 180 filters out omni-directional noise and preserves directional noise (e.g., an audio input difference between two microphones) in audio input. In examples, the sound processing engine 180 removes frequencies above or below human speaking voice frequencies. In examples, the sound processing engine 180 subtracts audio output of the device from the audio input to filter out the audio content being provided by the device. (e.g., to reduce the need of the user to shout over playing music). In examples, the sound processing engine 180 performs echo cancellation. By using one or more of these techniques, the sound processing engine 180 provides sound processing customized for use in a vehicle environment.

In other embodiments, the sound processing engine 180 operates to process the received sound signals to identify the sources of particular sounds of the sound signals, such as people's conversation in the vehicle, the vehicle engine sound, or other ambient sounds associated with the vehicle.

In some embodiments, a recording of sounds captured using the sound detection device 162 can be analyzed using speech recognition technology to identify words spoken by the user. The words may be recognized as commands from the user that alter the playback of media content and/or other functions or aspect of the PMSA system 110. In some embodiments, the words and/or the recordings may also be analyzed using natural language processing and/or intent recognition technology to determine appropriate actions to take based on the spoken words. Additionally or alternatively, the sound processing engine 180 may determine various sound properties about the sounds proximate the PMSA system 110 such as volume, dominant frequency or frequencies, etc. These sound properties may be used to make inferences about the environment proximate to the PMSA system 110.

Figure 3:
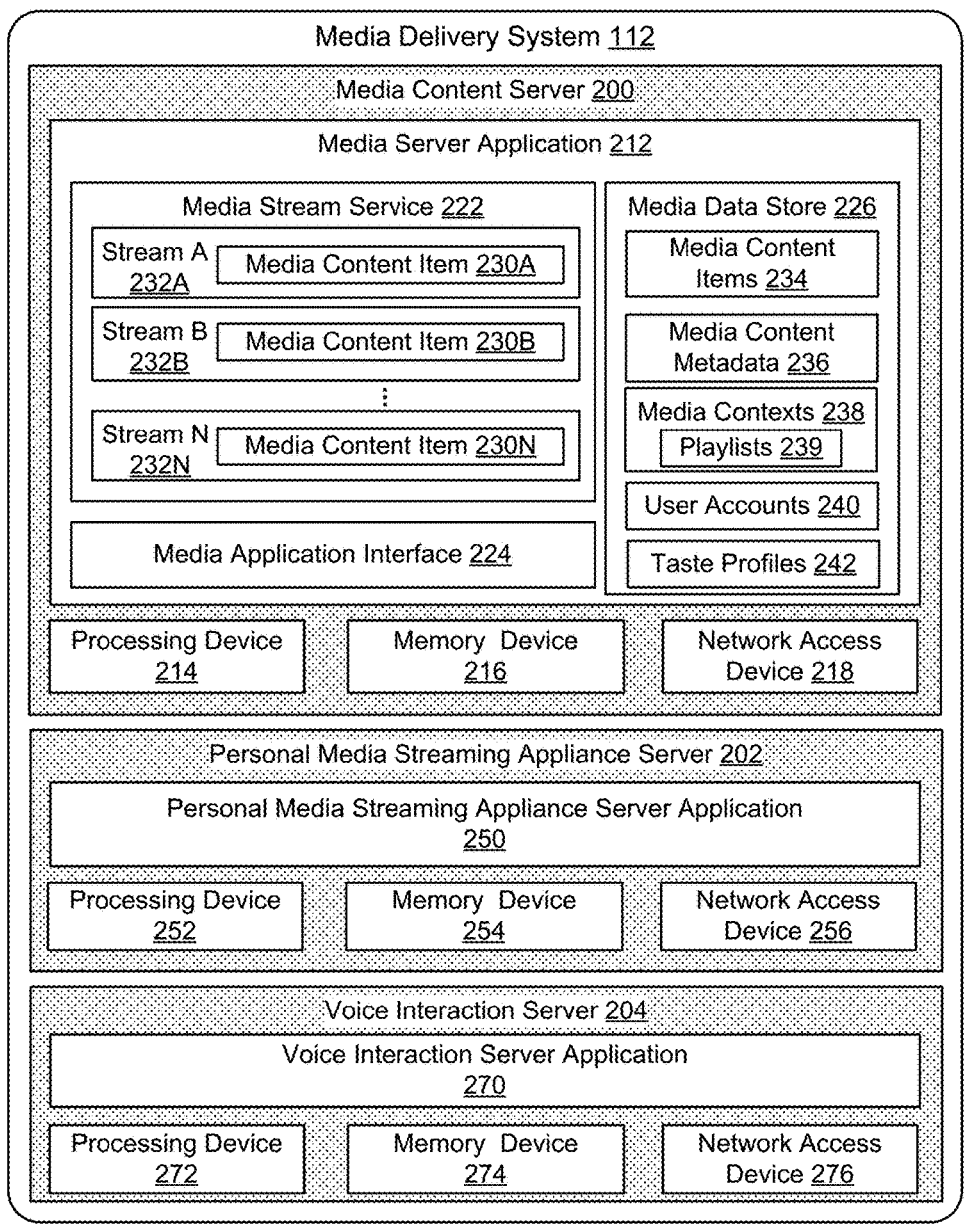
FIG. 3 is a block diagram of an example embodiment of a media delivery system.

The voice interaction engine 182 operates to cooperate with the media delivery system 112 (e.g., a voice interaction server 204 thereof as illustrated in FIG. 3) to identify a command (e.g., a user intent) that is conveyed by the voice input 156. In some embodiments, the voice interaction engine 182 transmits the user's voice input 156 that is detected by the sound processing engine 180 to the media delivery system 112 so that the media delivery system 112 operates to determine a command intended by the voice input 156. In other embodiments, at least some of the determination process of the command can be performed locally by the voice interaction engine 182.

In addition, some embodiments of the voice interaction engine 182 can operate to cooperate with the media delivery system 112 (e.g., the voice interaction server 204 thereof) to provide a voice assistant that performs various voice-based interactions with the user, such as voice feedbacks, voice notifications, voice recommendations, and other voice-related interactions and services.

FIG. 3 is a block diagram of an example embodiment of the media delivery system 112 of FIG. 1. The media delivery system 112 includes a media content server 200, a personal media streaming appliance (PMSA) server 202, and a voice interaction server 204.

The media delivery system 112 comprises one or more computing devices and provides media content to the PMSA system 110 and, in some embodiments, other media playback devices, such as the mobile computing device 118, as well. In addition, the media delivery system 112 interacts with the PMSA system 110 to provide the PMSA system 110 with various functionalities.

In at least some embodiments, the media content server 200, the PMSA server 202, and the voice interaction server 204 are provided by separate computing devices. In other embodiments, the media content server 200, the PMSA server 202, and the voice interaction server 204 are provided by the same computing device(s). Further, in some embodiments, at least one of the media content server 200, the PMSA server 202, and the voice interaction server 204 is provided by multiple computing devices. For example, the media content server 200, the PMSA server 202, and the voice interaction server 204 may be provided by multiple redundant servers located in multiple geographic locations.

Although FIG. 3 shows a single media content server 200, a single PMSA server 202, and a single voice interaction server 204, some embodiments include multiple media servers, multiple PMSA servers, and/or multiple voice interaction servers. In these embodiments, each of the multiple media servers, multiple PMSA serves, and multiple voice interaction servers may be identical or similar to the media content server 200, the PMSA server 202, and the voice interaction server, respectively, as described herein, and may provide similar functionality with, for example, greater capacity and redundancy and/or services from multiple geographic locations. Alternatively, in these embodiments, some of the multiple media servers, the multiple PMSA servers, and/or the multiple voice interaction servers may perform specialized functions to provide specialized services. Various combinations thereof are possible as well.

The media content server 200 transmits stream media 210 (FIG. 2) to media playback devices such as the PMSA system 110. In some embodiments, the media content server 200 includes a media server application 212, a processing device 214, a memory device 216, and a network access device 218. The processing device 214 and the memory device 216 may be similar to the processing device 148 and the memory device 150, respectively, which have each been previously described. Therefore, the description of the processing device 214 and the memory device 216 are omitted for brevity purposes.

The network access device 218 operates to communicate with other computing devices over one or more networks, such as the network 116. Examples of the network access device include one or more wired network interfaces and wireless network interfaces. Examples of such wireless network interfaces of the network access device 218 include wireless wide area network (WWAN) interfaces (including cellular networks) and wireless local area network (WLANs) interfaces. In other examples, other types of wireless interfaces can be used for the network access device 218.

In some embodiments, the media server application 212 is configured to stream media content, such as music or other audio, video, or other suitable forms of media content. The media server application 212 includes a media stream service 222, a media application interface 224, and a media data store 226. The media stream service 222 operates to buffer media content, such as media content items 230A, 230B, and 230N (collectively 230), for streaming to one or more streams 232A, 232B, and 232N (collectively 232).

The media application interface 224 can receive requests or other communication from media playback devices or other systems, such as the PMSA system 110, to retrieve media content items from the media content server 200. For example, in FIG. 2, the media application interface 224 receives communication from the PMSA system 110, such as the caching management engine 174 thereof, to receive media content from the media content server 200.

In some embodiments, the media data store 226 stores media content items 234, media content metadata 236, media contexts 238, user accounts 240, and taste profiles 242. The media data store 226 may comprise one or more databases and file systems. Other embodiments are possible as well.

As discussed herein, the media content items 234 (including the media content items 230) may be audio, video, or any other type of media content, which may be stored in any format for storing media content.

The media content metadata 236 provide various information associated with the media content items 234. In some embodiments, the media content metadata 236 includes one or more of title, artist name, album name, length, genre, mood, era, etc.

The media content metadata 236 operates to provide various pieces of information associated with the media content items 234. In some embodiments, the media content metadata 236 includes one or more of title, artist name, album name, length, genre, mood, era, etc.

In some embodiments, the media content metadata 236 includes acoustic metadata, cultural metadata, and explicit metadata. The acoustic metadata may be derived from analysis of the track refers to a numerical or mathematical representation of the sound of a track. Acoustic metadata may include temporal information such as tempo, rhythm, beats, downbeats, tatums, patterns, sections, or other structures. Acoustic metadata may also include spectral information such as melody, pitch, harmony, timbre, chroma, loudness, vocalness, or other possible features. Acoustic metadata may take the form of one or more vectors, matrices, lists, tables, and other data structures. Acoustic metadata may be derived from analysis of the music signal. One form of acoustic metadata, commonly termed an acoustic fingerprint, may uniquely identify a specific track. Other forms of acoustic metadata may be formed by compressing the content of a track while retaining some or all of its musical characteristics.

The cultural metadata refers to text-based information describing listeners' reactions to a track or song, such as styles, genres, moods, themes, similar artists and/or songs, rankings, etc. Cultural metadata may be derived from expert opinion such as music reviews or classification of music into genres. Cultural metadata may be derived from listeners through websites, chatrooms, blogs, surveys, and the like. Cultural metadata may include sales data, shared collections, lists of favorite songs, and any text information that may be used to describe, rank, or interpret music. Cultural metadata may also be generated by a community of listeners and automatically retrieved from Internet sites, chat rooms, blogs, and the like. Cultural metadata may take the form of one or more vectors, matrices, lists, tables, and other data structures. A form of cultural metadata particularly useful for comparing music is a description vector. A description vector is a multi-dimensional vector associated with a track, album, or artist. Each term of the description vector indicates the probability that a corresponding word or phrase would be used to describe the associated track, album or artist.

The explicit metadata refers to factual or explicit information relating to music. Explicit metadata may include album and song titles, artist and composer names, other credits, album cover art, publisher name and product number, and other information. Explicit metadata is generally not derived from the music itself or from the reactions or opinions of listeners.

At least some of the metadata 236, such as explicit metadata (names, credits, product numbers, etc.) and cultural metadata (styles, genres, moods, themes, similar artists and/or songs, rankings, etc.), for a large library of songs or tracks can be evaluated and provided by one or more third party service providers. Acoustic and cultural metadata may take the form of parameters, lists, matrices, vectors, and other data structures. Acoustic and cultural metadata may be stored as XML files, for example, or any other appropriate file type. Explicit metadata may include numerical, text, pictorial, and other information. Explicit metadata may also be stored in an XML, or other file. All or portions of the metadata may be stored in separate files associated with specific tracks. All or portions of the metadata, such as acoustic fingerprints and/or description vectors, may be stored in a searchable data structure, such as a k-D tree or other database format.

Referring still to FIG. 3, each of the media contexts 238 is used to identify one or more media content items 234. In some embodiments, the media contexts 238 are configured to group one or more media content items 234 and provide a particular context to the group of media content items 234. Some examples of the media contexts 238 include albums, artists, playlists, and individual media content items. By way of example, where a media context 238 is an album, the media context 238 can represent that the media content items 234 identified by the media context 238 are associated with that album.

As described above, the media contexts 238 can include playlists 239. The playlists 239 are used to identify one or more of the media content items 234. In some embodiments, the playlists 239 identify a group of the media content items 234 in a particular order. In other embodiments, the playlists 239 merely identify a group of the media content items 234 without specifying a particular order. Some, but not necessarily all, of the media content items 234 included in a particular one of the playlists 239 are associated with a common characteristic such as a common genre, mood, or era.

In some embodiments, a user can listen to media content items in a playlist 239 by selecting the playlist 239 via a media playback device 104, such as the PMSA system 110. The media playback device 104 then operates to communicate with the media delivery system 112 so that the media delivery system 112 retrieves the media content items identified by the playlist 239 and transmits data for the media content items to the media playback device 104 for playback.

In some embodiments, the playlist 239 includes a playlist title and a list of content media item identifications. The playlist title is a title of the playlist, which can be provided by a user using the media playback device 104. The list of content media item identifications includes one or more media content item identifications (IDs) that refer to respective media content items 170.

Each media content item is identified by a media content item ID and includes various pieces of information, such as a media content item title, artist identification (e.g., individual artist name or group name, or multiple artist names or group names), and media content item data. In some embodiments, the media content item title and the artist ID are part of the media content metadata 236, which can further include other attributes of the media content item, such as album name, length, genre, mood, era, etc. as described herein.

At least some of the playlists 239 may include user-created playlists. For example, a user of a media streaming service provided using the media delivery system 112 can create a playlist 239 and edit the playlist 239 by adding, removing, and rearranging media content items in the playlist 239. A playlist 239 can be created and/or edited by a group of users together to make it a collaborative playlist. In some embodiments, user-created playlists can be available to a particular user only, a group of users, or to the public based on a user-definable privacy setting.

In some embodiments, when a playlist is created by a user or a group of users, the media delivery system 112 operates to generate a list of media content items recommended for the particular user or the particular group of users. In some embodiments, such recommended media content items can be selected based at least on the taste profiles 242 as described herein. Other information or factors can be used to determine the recommended media content items. Examples of determining recommended media content items are described in U.S. patent application Ser. No. 15/858,377, titled MEDIA CONTENT ITEM RECOMMENDATION SYSTEM, filed Dec. 29, 2017, the disclosure of which is hereby incorporated by reference in its entirety.

In addition or alternatively, at least some of the playlists 239 are created by a media streaming service provider. For example, such provider-created playlists can be automatically created by the media delivery system 112. In some embodiments, a provider-created playlist can be customized to a particular user or a particular group of users. By way of example, a playlist for a particular user can be automatically created by the media delivery system 112 based on the user's listening history (e.g., the user's taste profile) and/or listening history of other users with similar tastes. In other embodiments, a provider-created playlist can be configured to be available for the public in general. Provider-created playlists can also be sharable with to other users.

The user accounts 240 are used to identify users of a media streaming service provided by the media delivery system 112. In some embodiments, a user account 240 allows a user to authenticate to the media delivery system 112 and enable the user to access resources (e.g., media content items, playlists, etc.) provided by the media delivery system 112. In some embodiments, the user can use different devices (e.g., the PMSA system 110 and the mobile computing device 118) to log into the user account and access data associated with the user account in the media delivery system 112. User authentication information, such as a username, an email account information, a password, and other credentials, can be used for the user to log into his or her user account.

The taste profiles 242 contain records indicating media content tastes of users. A taste profile can be associated with a user and used to maintain an in-depth understanding of the music activity and preference of that user, enabling personalized recommendations, taste profiling and a wide range of social music applications. Libraries and wrappers can be accessed to create taste profiles from a media library of the user, social website activity and other specialized databases to mine music preferences.

In some embodiments, each taste profile 242 is a representation of musical activities, such as user preferences and historical information about the users' consumption of media content, and can include a wide range of information such as artist plays, song plays, skips, dates of listen by the user, songs per day, playlists, play counts, start/stop/skip data for portions of a song or album, contents of collections, user rankings, preferences, or other mentions received via a client device, or other media plays, such as websites visited, book titles, movies watched, playing activity during a movie or other presentations, ratings, or terms corresponding to the media, such as "comedy", "sexy", etc.

In addition, the taste profiles 242 can include other information. For example, the taste profiles 242 can include libraries and/or playlists of media content items associated with the user. The taste profiles 242 can also include information about the user's relationships with other users (e.g., associations between users that are stored by the media delivery system 112 or on a separate social media site).

The taste profiles 242 can be used for a number of purposes. One use of taste profiles is for creating personalized playlists (e.g., personal playlisting). An API call associated with personal playlisting can be used to return a playlist customized to a particular user. For example, the media content items listed in the created playlist are constrained to the media content items in a taste profile associated with the particular user. Another example use case is for event recommendation. A taste profile can be created, for example, for a festival that contains all the artists in the festival. Music recommendations can be constrained to artists in the taste profile. Yet another use case is for personalized recommendation, where the contents of a taste profile are used to represent an individual's taste. This API call uses a taste profile as a seed for obtaining recommendations or playlists of similar artists. Yet another example taste profile use case is referred to as bulk resolution. A bulk resolution API call is used to resolve taste profile items to pre-stored identifiers associated with a service, such as a service that provides metadata about items associated with the taste profile (e.g., song tempo for a large catalog of items). Yet another example use case for taste profiles is referred to as user-to-user recommendation. This API call is used to discover users with similar tastes by comparing the similarity of taste profile item(s) associated with users.

A taste profile 242 can represent a single user or multiple users. Conversely, a single user or entity can have multiple taste profiles 242. For example, one taste profile can be generated in connection with a user's media content play activity, whereas another separate taste profile can be generated for the same user based the user's selection of media content items and/or artists for a playlist.

Referring still to FIG. 3, the PMSA server 202 operates to provide various functionalities to the PMSA system 110. In some embodiments, the PMSA server 202 includes a personal media streaming appliance (PMSA) server application 250, a processing device 252, a memory device 254, and a network access device 256. The processing device 252, the memory device 254, and the network access device 256 may be similar to the processing device 214, the memory device 216, and the network access device 218, respectively, which have each been previously described.

In some embodiments, the PMSA server application 250 operates to interact with the PMSA system 110 and enable the PMSA system 110 to perform various functions, such as receiving a user manual input, displaying information, providing notifications, performing power management, providing location-based services, and authenticating one or more users for the PMSA system 110. The PMSA server application 250 can interact with other servers, such as the media content server 200 and the voice interaction server 204, to execute such functions.

Referring still to FIG. 3, the voice interaction server 204 operates to provide various voice-related functionalities to the PMSA system 110. In some embodiments, the voice interaction server 204 includes a voice interaction server application 270, a processing device 272, a memory device 274, and a network access device 276. The processing device 272, the memory device 274, and the network access device 276 may be similar to the processing device 214, the memory device 216, and the network access device 218, respectively, which have each been previously described.

In some embodiments, the voice interaction server application 270 operates to interact with the PMSA system 110 and enable the PMSA system 110 to perform various voice-related functions, such as voice feedback and voice notifications. In some embodiments, the voice interaction server application 270 is configured to receive data (e.g., speech-to-text (STT) data) representative of a voice input received via the PMSA system 110 and process the data to determine a user command (e.g., a user request or instruction). In some embodiments, at least one of the media content server 200, the PMSA server 202, and the voice interaction server 204 may be used to perform one or more functions corresponding the determined user command.

Figure 4:
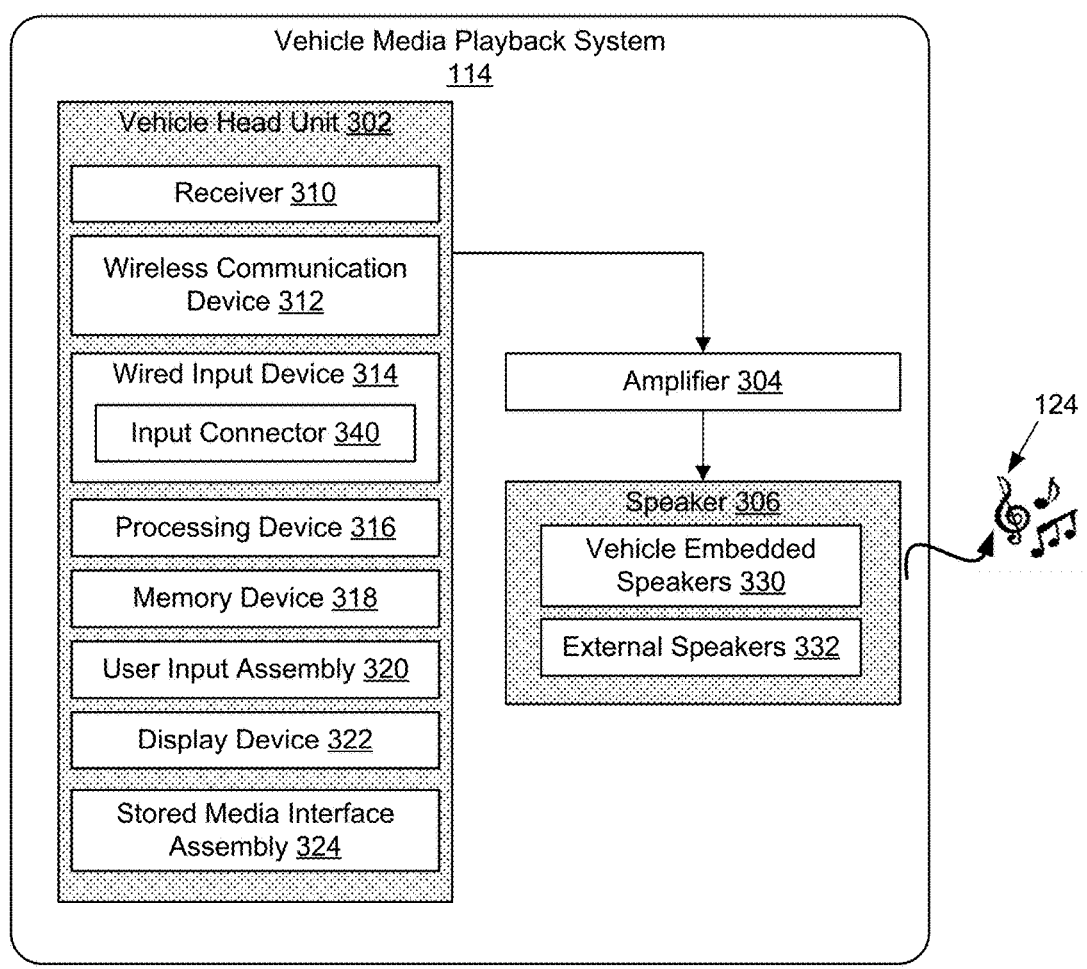
FIG. 4 is a block diagram of an example embodiment of a vehicle media playback system.

FIG. 4 is a block diagram of an example embodiment of the vehicle media playback system 114. In this example, the vehicle media playback system 114 includes a vehicle head unit 302, an amplifier 304, and a speaker 306.

The vehicle head unit 302 is configured to receive a user input and generate media content from various sources. In this example, the vehicle head unit 302 includes a receiver 310, a wireless communication device 312, a wired input device 314, a processing device 316, a memory device 318, a user input assembly 320, a display device 322, and a stored media interface assembly 324.

The receiver 310 operates to receive media content signals from various external sources. The received signals can then be used to generate media output by the vehicle media playback system 264. Some embodiments of the receiver 310 include one or more tuners for receiving radio signals such as FM or AM radio signals. Other embodiments of the receiver 310 include a receiver for receiving satellite radio signals and/or a receiver for receiving internet radio signals.

The wireless communication device 312 operates to communicate with other devices using wireless data signals. The wireless communication device 312 can include one or more of a Bluetooth transceiver and a Wi-Fi transceiver. The wireless data signal may comprise a media content signal such as an audio or video signal. In some embodiments, the wireless communication device 312 is used to enable the vehicle media playback system 114 to wirelessly communicate with the PMSA system 110 and receive the media content signal 164 (FIG. 2) from the PMSA system 110 via an in-vehicle wireless network. The in-vehicle wireless network between the PMSA system 110 and the vehicle media playback system 114 can be configured similarly to the in-vehicle wireless data communication 122 (FIG. 2).

The wired input device 314 provides an interface configured to receive a cable for providing media content and/or commands. The wired input device 314 includes an input connector 340 configured to receive a plug extending from a media playback device for transmitting a signal for media content. In some embodiments, the wired input device 314 can include an auxiliary input jack (AUX) for receiving a plug from a media playback device that transmits analog audio signals. The wired input device 314 can also include different or multiple input jacks for receiving plugs from media playback devices that transmit other types of analog or digital signals (e.g., USB, HDMI, Composite Video, YPbPr, DVI). In some embodiments, the wired input device 314 is also used to receive instructions from other devices.

In some embodiments, the wired input device 314 provides the input connector 340 (e.g., an AUX port) for receiving a connector 552 extending from the PMSA system 110, as illustrated in FIG. 6. The media content signal 164 is then transmitted from the PMSA system 110 to the vehicle media playback system 114 via the cable 550, the connector 552, and the input connector 340.

The processing device 316 operates to control various devices, components, and elements of the vehicle media playback system 114. The processing device 316 can be configured similar to the processing device 148 (FIG. 2) and, therefore, the description of the processing device 316 is omitted for brevity purposes.

In some embodiments, the processing device 316 operates to process the media content signal 164 received from the PMSA system 110 and convert the signal 164 to a format readable by the vehicle media playback system 114 for playback.

The memory device 318 is configured to store data and instructions that are usable to control various devices, components, and elements of the vehicle media playback system 114. The memory device 318 can be configured similar to the memory device 150 (FIG. 2) and, therefore, the description of the memory device 318 is omitted for brevity purposes.

The user input assembly 320 includes one or more input devices for receiving user input from users for controlling the vehicle media playback system 114. In some embodiments, the user input assembly 320 includes multiple knobs, buttons, and other types of input controls for adjusting volume, selecting sources and content, and adjusting various output parameters. In some embodiments, the various input devices are disposed on or near a front surface of the vehicle head unit 302. The various input devices can also be disposed on the steering wheel of the vehicle or elsewhere. Additionally or alternatively, the user input assembly 320 can include one or more touch sensitive surfaces, which can be incorporated in the display device 322.

The display device 322 displays information. In some embodiments, the display device 322 includes a liquid crystal display (LCD) panel for displaying textual information about content and/or settings of the vehicle media playback system 114. The display device 322 can also include other types of display panels such as a light emitting diode (LED) panel. In some embodiments, the display device 322 can also display image or video content.

The stored media interface assembly 324 reads media content stored on a physical medium. In some embodiments, the stored media interface assembly 324 comprises one or more devices for reading media content from a physical medium such as a compact disc or cassette tape.

The amplifier 304 operates to amplify a signal received from the vehicle head unit 302 and transmits the amplified signal to the speaker 306. In this manner, the media output 124 can be played back at a greater volume. The amplifier 304 may include a power source to power the amplification.

The speaker 306 operates to produce an audio output (e.g., the media output 124) based on an electronic signal. The speaker 306 can include one or more vehicle embedded speakers 330 disposed at various locations within the vehicle 80. In some embodiments, separate signals are received for at least some of the speakers (e.g., to provide stereo or surround sound).

In other embodiments, the speaker 306 can include one or more external speakers 332 which are arranged within the vehicle 80. Users may bring one or more external speakers 332 into the vehicle 80 and connect the external speakers 332 to the vehicle head unit 302 using a wired interface or a wireless interface. In some embodiments, the external speakers 332 can be connected to the vehicle head unit 302 using Bluetooth. Other wireless protocols can be used to connect the external speakers 332 to the vehicle head unit 302. In other embodiments, a wired connection (e.g., a cable) can be used to connect the external speakers 332 to the vehicle head unit 302. Examples of the wired connection include an analog or digital audio cable connection and a universal serial bus (USB) cable connection. The external speaker 332 can also include a mechanical apparatus for attachment to a structure of the vehicle.

Figure 5:
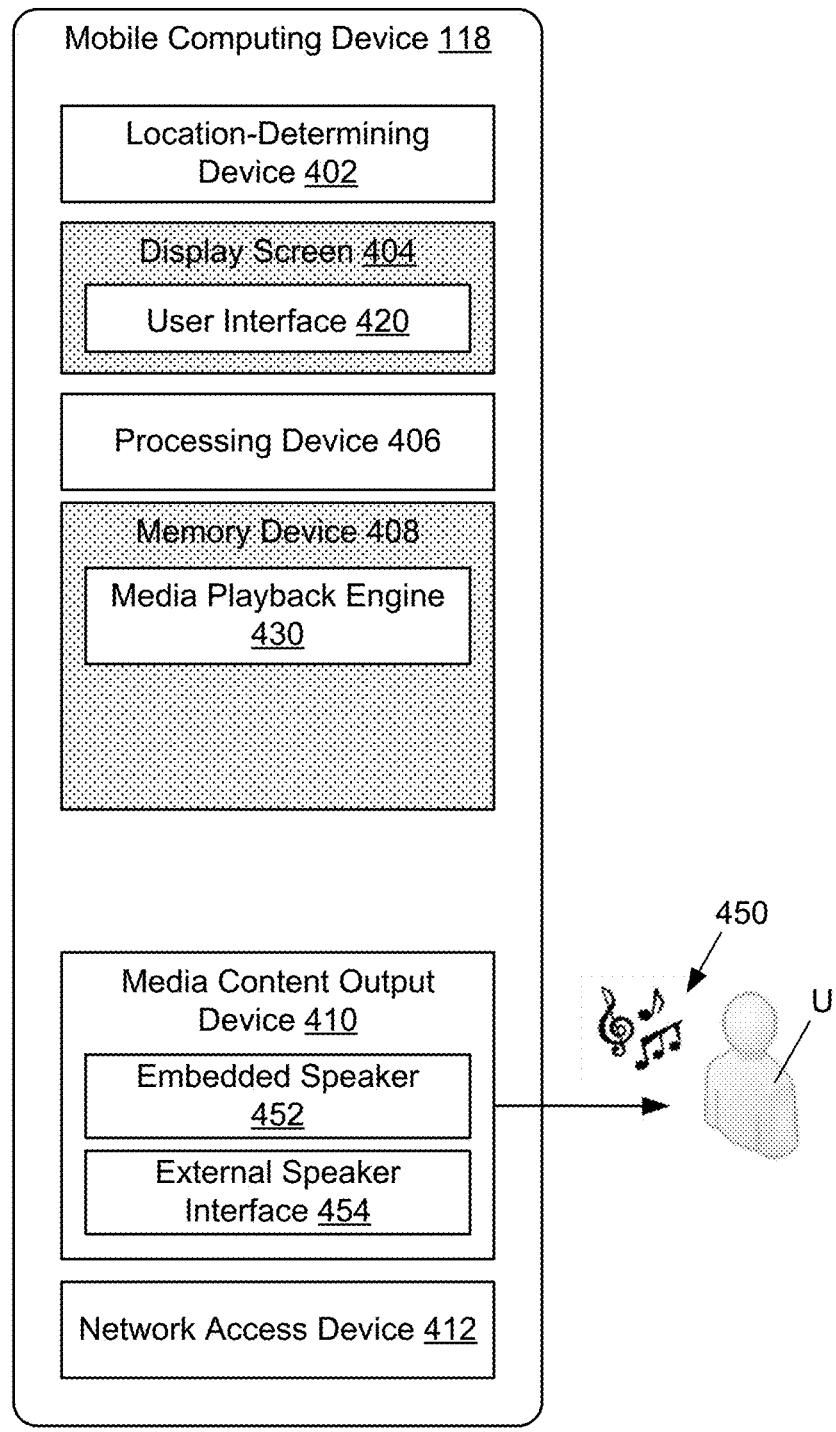
FIG. 5 is a block diagram of an example embodiment of a mobile computing device.

FIG. 5 is a block diagram of an example embodiment of the mobile computing device 118 of FIG. 1.

Similar to the PMSA system 110, the mobile computing device 118 can also be used to play media content. For example, the mobile computing device 118 is configured to play media content that is provided (e.g., streamed or transmitted) by a system external to the mobile computing device 118, such as the media delivery system 112, another system, or a peer device. In other examples, the mobile computing device 118 operates to play media content stored locally on the mobile computing device 118. In yet other examples, the mobile computing device 118 operates to play media content that is stored locally as well as media content provided by other systems.

In some embodiments, the mobile computing device 118 is a handheld or portable entertainment device, smartphone, tablet, watch, wearable device, or any other type of computing device capable of playing media content. In other embodiments, the mobile computing device 118 is a laptop computer, desktop computer, television, gaming console, set-top box, network appliance, blue-ray or DVD player, media player, stereo, or radio.

As described herein, the mobile computing device 118 is distinguished from the PMSA system 110 in various aspects. For example, unlike the PMSA system 110, the mobile computing device 118 is not limited to playing media content, but configured for a wide range of functionalities in various situations and places. The mobile computing device 118 is capable of running a plurality of different software applications for different purposes. The mobile computing device 118 enables the user to freely start or stop activation of such individual software applications.

In at least some embodiments, the mobile computing device 118 includes a location-determining device 402, a display screen 404, a processing device 406, a memory device 408, a content output device 410, and a network access device 412. Other embodiments may include additional, different, or fewer components. For example, some embodiments may include a recording device such as a microphone or camera that operates to record audio or video content.

The location-determining device 402 is a device that determines the location of the mobile computing device 118. In some embodiments, the location-determining device 402 uses one or more of Global Positioning System (GPS) technology (which may receive GPS signals), Global Navigation Satellite System (GLONASS), cellular triangulation technology, network-based location identification technology, Wi-Fi positioning systems technology, and combinations thereof.

The display screen 404 is configured to display information. In addition, the display screen 404 is configured as a touch sensitive display and includes a user interface 420 for receiving a user input from a selector (e.g., a finger, stylus etc.) controlled by the user U. In some embodiments, therefore, the display screen 404 operates as both a display device and a user input device. The touch sensitive display screen 404 operates to detect inputs based on one or both of touches and near-touches. In some embodiments, the display screen 404 displays a graphical user interface for interacting with the mobile computing device 118. Other embodiments of the display screen 404 do not include a touch sensitive display screen. Some embodiments include a display device and one or more separate user interface devices. Further, some embodiments do not include a display device.

In some embodiments, the processing device 406 comprises one or more central processing units (CPU). In other embodiments, the processing device 406 additionally or alternatively includes one or more digital signal processors, field-programmable gate arrays, or other electronic circuits.

The memory device 408 operates to store data and instructions. In some embodiments, the memory device 408 stores instructions for a media playback engine 430.

The memory device 408 may be configured similarly to the memory device 150 (FIG. 2) and, therefore, the description of the memory device 408 is omitted for brevity purposes.

The media playback engine 430 operates to play media content to the user U. As described herein, the media playback engine 430 is configured to communicate with the media delivery system 112 to receive one or more media content items (e.g., through the stream media 232). In other embodiments, the media playback engine 430 is configured to play media content that is locally stored in the mobile computing device 118.

In some embodiments, the media playback engine 430 operates to retrieve one or more media content items that are either locally stored in the mobile computing device 118 or remotely stored in the media delivery system 114. In some embodiments, the media playback engine 430 is configured to send a request to the media delivery system 114 for media content items and receive information about such media content items for playback.

Referring still to FIG. 5, the content output device 410 operates to output media content. In some embodiments, the content output device 410 generates media output 450 for the user U. In some embodiments, the content output device 410 includes one or more embedded speakers 452 which are incorporated in the mobile computing device 118. Therefore, the mobile computing device 118 can be used as a standalone device that generates the media output 450.

In addition, some embodiments of the mobile computing device 118 include an external speaker interface 454 as an alternative output of media content. The external speaker interface 454 is configured to connect the mobile computing device 118 to another system having one or more speakers, such as headphones, portal speaker assemblies, and the vehicle media playback system 114, so that the media output 450 is generated via the speakers of the other system external to the mobile computing device 118. Examples of the external speaker interface 454 include an audio output jack, a Bluetooth transmitter, a display panel, and a video output jack. Other embodiments are possible as well. For example, the external speaker interface 454 is configured to transmit a signal through the audio output jack or Bluetooth transmitter that can be used to reproduce an audio signal by a connected or paired device such as headphones or a speaker.

The network access device 412 operates to communicate with other computing devices over one or more networks, such as the network 116 and the in-vehicle wireless data communication 122. Examples of the network access device 412 include wired network interfaces and wireless network interfaces. Wireless network interfaces includes infrared, BLUETOOTH® wireless technology, 802.11a/b/g/n/ac, and cellular or other radio frequency interfaces in at least some possible embodiments.

FIG. 6 schematically illustrates an example embodiment of the PMSA system 110 of FIG. 1. In this example, the PMSA system 110 includes a personal media streaming appliance (PMSA) 500 and a docking device 502.

As described herein, the PMSA system 110 is sized to be relatively small so that the PMSA system 110 can be easily mounted to a structure (e.g., a dashboard or head unit) of the vehicle 80 where the user can conveniently manipulate the PMSA system 110. By way of example, the PMSA system 110 is configured to be smaller than a typical mobile computing device, such as a smartphone. Further, the PMSA 500 provides a simplified user interface for controlling playback of media content. For example, the PMSA 500 has a limited set of physical control elements, such as a single rotary knob and one or more physical buttons as described below, so that the user can easily control the PMSA system 110 in the vehicle 80 (FIG. 1).

The PMSA 500 is configured to include at least some of the devices of the PMSA system 110 as illustrated with reference to FIG. 2. In some embodiments, the PMSA 500 includes all of the devices of the PMSA system 110 as illustrated in FIG. 2.

As illustrated also in FIG. 2, some embodiments of the PMSA 500 includes the user input device 130 that includes the manual input device 160 and the sound detection device 162. Some embodiments of the manual input device 160 include a control knob 510 and one or more physical buttons 512.

In some embodiments, the control knob 510 is configured to be maneuverable in multiple ways. For example, the control knob 510 provides a plurality of regions on a knob face 514 that are independently depressible upon receiving a user's pressing action against the knob face 514. In the illustrated example, the control knob 510 has five regions 516 (e.g., up, down, left, right, and middle) that are separately depressible. At least some of the regions 516 are configured to receive inputs of different user commands (e.g., requests or instructions).

In other embodiments, the control knob 510 is configured to be manipulated in different ways, such as tilting in multiple directions or sliding in multiple directions.

In addition, the control knob 510 is configured to be rotatable. For example, the user can hold the control knob 510 and rotate with respect to a body 520 of the PMSA 500. The control knob 510 can be rotatable in both directions 522 (e.g., clockwise and counterclockwise). In other embodiments, the control knob 510 is configured to rotate in only one direction.

The control knob 510 is used to receive user inputs for controlling playback of media content. In addition or alternatively, the control knob 510 can be used to receive user inputs for other purposes or functions.

The physical buttons 512 are configured to be depressed upon receiving a user's pressing action against the physical buttons 512. In the illustrated example, the PMSA 500 has four physical buttons 512A-512D. In some embodiments, each of the physical buttons 512 is configured to receive a single user command. In other embodiments, at least one of the physical buttons 512 is configured to receive multiple user commands.

In some embodiments, the physical buttons 512 are used as buttons that are preset to be associated with particular media content, thereby facilitating playback of such media content. In these embodiments, the physical buttons 512 are also referred to as preset buttons 512.

In addition, the PMSA 500 also includes the display screen 132. In some embodiments, the display screen 132 is arranged at the knob face 514 of the control knob 510. As described herein, in some embodiments, the display screen 132 does not include a touch sensitive display screen, and is configured as a display device only. In other embodiments, however, the display screen 132 can be configured to be touch sensitive and receive a user input through the display screen 132 as well.

Referring still to FIG. 6, the docking device 502 is configured to mount the PMSA 500 to a structure of the vehicle 80. The docking device 502 is configured to removably mount the PMSA 500 thereto. The docking device 502 is further configured to attach to a structure of the vehicle 80 (FIG. 1) so that the PMSA 500 is positioned at the structure of the vehicle 80.

In some embodiments, an interface between the PMSA 500 and the docking device 502 is configured to prevent the PMSA 500 from rotating relative to the docking device 502 when the control knob 510 is manipulated by a user. For example, the docking device 502 has a portion (e.g., a front portion of the docking device 502) configured to interlock a corresponding portion of the PMSA 500 (e.g., a rear portion of the PMSA 500) when the PMSA 500 is mounted to the docking device 502 such that the portion of the docking device 502 and the corresponding portion of the PMSA 500 form the interface therebetween.

In addition or alternatively, the PMSA 500 and the docking device 502 include magnetic materials at the interface therebetween so that the PMSA 500 and the docking device 502 are magnetically coupled to each other.

In some embodiments, the docking device 502 includes one or more electrical contacts 530 that are electrically connected to corresponding electrical contacts (not shown in FIG. 6) of the PMSA 500 when the PMSA 500 is mounted to the docking device 502. Such electrical connection between the PMSA 500 and the docking device 502 is provided for various functions.

First, as described herein, the PMSA 500 does not include a battery sufficient for a prolonged use without an external power supply. In some embodiments, the PMSA 500 is primarily powered by a vehicle power supply 540. In some embodiments, the docking device 502 has a power receiving line 544 for connection to the vehicle power supply 540. For example, the power receiving line 544 extends from the docking device 502 and has a power connector 546 at a free end that is configured to mate with a vehicle power outlet 542 (e.g., a 12V auxiliary power outlet) of the vehicle power supply 540. As such, the docking device 502 receives electric power from the vehicle power supply 540 via the power receiving line 544, and the electrical connection between the PMSA 500 and the docking device 502 is configured to deliver electric power from the docking device 502 to the PMSA 500.

Second, as described herein, the PMSA 500 does not have a speaker and is designed to transmit media content signals to the vehicle media playback system 114 so that the media content is played through the vehicle media playback system 114. In some embodiments, the docking device 502 includes a media content output line 550 (also referred to herein as a media content output cable) (e.g., an auxiliary (AUX) output) configured to connect with the vehicle media playback input connector 340 (e.g., an auxiliary (AUX) port) of the vehicle media playback system 114. The docking device 502 is configured to receive media content signals from the PMSA 500 via the electrical connection between the PMSA 500 and the docking device 502, and transmit the signals to the vehicle media playback system 114 via the media content output line 550. In the illustrated embodiment, the power receiving line 544 and the media content output line 550 are combined to be a single line extending from the docking device 502 until the power connector 546, and the media content output line 550 further extends (or branches out) from the power connector 546 and terminates at a media output connector 552. The media output connector 552 is configured to connect to the vehicle media playback input connector 340 of the vehicle media playback system 114. In other embodiments, the media content output line 550 and the power receiving line 544 extend separately from the docking device 502.

In other embodiments, one or more of the power receiving line 544 and the media content output line 550 are directly connected to, and extend from, the PMSA 500 so that electric power is directly supplied to the PMSA 500 without the docking device 502 involved, and that the media content is directly transmitted to the vehicle media playback system 114 without passing through the docking device 502.

Third, the electrical connection between the PMSA 500 and the docking device 502 can be used to detect connection between the PMSA 500 and the docking device 502.

Figure 7:
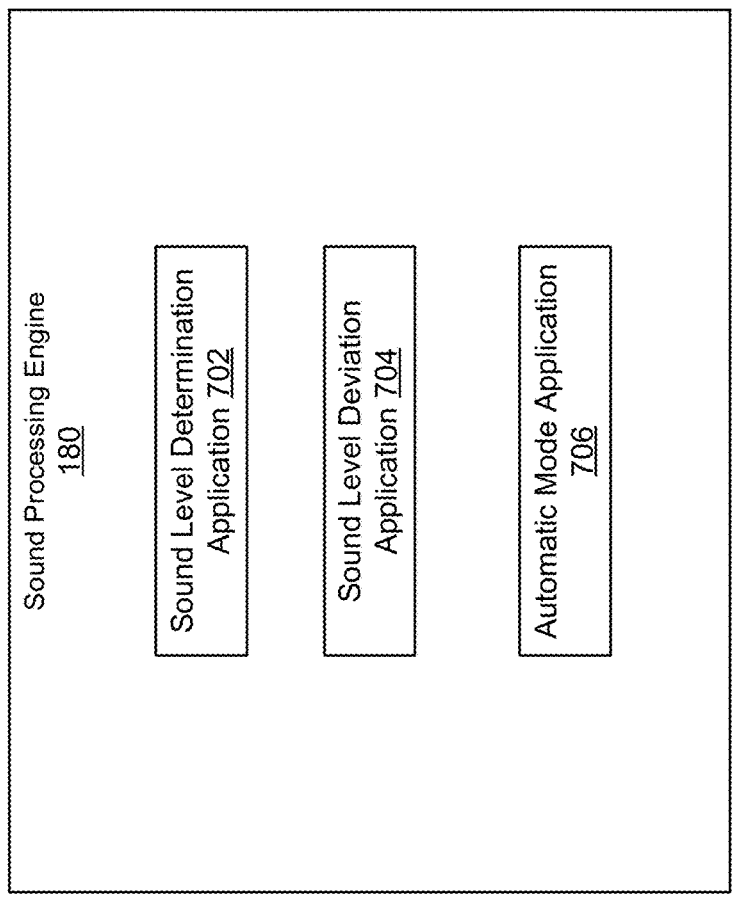
FIG. 7 is a block diagram of an exemplary embodiment of a sound processing engine of the PMSA system of FIG. 2.
Figure 8:
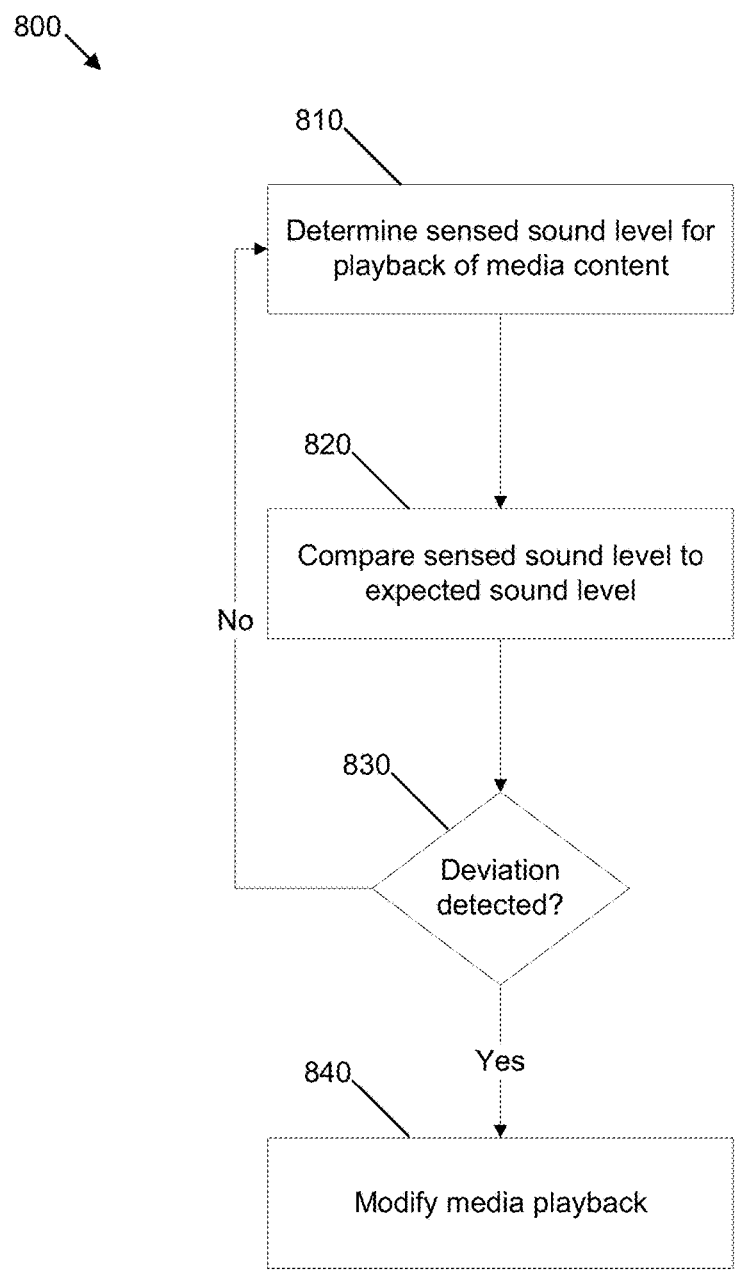
FIG. 8 illustrates an exemplary method for pausing playback of media content based upon a sound level of the playback of the media content.
Figure 9:
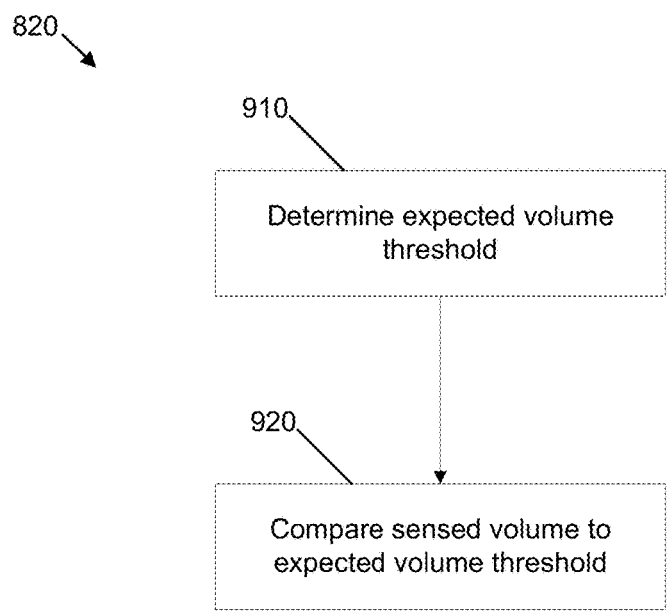
FIG. 9 illustrates additional details of the method of FIG. 8.

Referring now to FIGS. 7-9, when the PMSA system 110 is playing back media content, the PMSA system 110 can also monitor the sound level of the media content in the vehicle 102 to estimate whether or not the user U in the vehicle is actually listening to the media content. For example, the user U can lower the volume of the vehicle media playback system 114 that is playing the media content for various reasons, such as to answer a telephone call, to talk to another passenger, and/or to switch to another source of media content on the vehicle media playback system (e.g., radio) instead of listening to the media content from the PMSA system.

In such cases, although the PMSA system 110 continues playing the media content (i.e., streaming the media content to the vehicle media playback system 114), a sound level of the media content in the vehicle 102 is low or non-existent, as detected by the sound detection device 162. When this happens, the PMSA system 110 operates to modify the playback of the media content. For example, the PMSA system 110 can pause or otherwise stop playback of the media content. Further, an elapsed playback time of the media content (or other marker indicating when playback ceased) can be stored so that, when the user U comes back and plays the media content again, the media content can play from the point at which the playback was paused or otherwise stopped.

Referring now to FIG. 7, additional details of the sound processing engine 180 of the PMSA system 110 are provided. Generally, the sound processing engine 180 is programmed to determine a sound level of the media content playback within the vehicle 102 using, for example, the sound detection device 162. Based upon the sound level, the sound processing engine 180 is programmed to pause the playback of the media content by the PMSA system 110 for certain scenarios.

As illustrated, the sound processing engine 180 includes a sound level determination application 702, a sound level deviation application 704, and an automatic mode application 706.

The example sound level determination application 702 receives input from the sound detection device 162. As noted, the sound detection device 162 can, in one example, be one or more microphones positioned in the vehicle 102 to determine sound within the vehicle. For example, the one or more microphones can be arranged as a component of the PMSA system 110.

The sound level determination application 702 is programmed to receive sound data from the sounds in the vehicle 102 and use that sound data to determine a sound level associated with the playback of the media content by the PMSA system 110 in the vehicle, such as through the vehicle media playback system 114. For example, various filtering techniques can be used to remove other sources of sound (e.g., humans, road noise, etc.) from the sound data to determine the sound level for the playback of the media content.

The sound level is passed to the sound level deviation application 704. The sound level deviation application 704 is programmed to determine a change in the sound level for the playback of the media content. For example, various changes can occur in the sound level of the playback of the media content, such as: (i) a lowering of the sound level by the user below a threshold; and/or (ii) a substantial change in the sound level by the user at a given point in time.

In one instance, the sound level deviation application 704 is programmed with a threshold that represents a sound level below which it would be difficult for a user to hear the playback of the media content. The threshold could be preset, such as set at a specific absolute level below which it is difficult for the user U to hear.

In another instance, the threshold can be dynamic, such as by providing a variable threshold that is modified based upon the behavior of the user U. For example, the sound level deviation application 704 can use artificial intelligence and/or other machine learning techniques to determine an appropriate threshold for the user U. This could be developed, for example, by examining user behavior. For instance, when the user reduces the sound to a particular sound level and later rewinds the playback of the media content, the sound level deviation application 704 can use that particular sound level when determining the threshold.

In another instance, the sound level of the playback of media content can vary naturally over time depending on the media content. For example, some songs have portions that are softer and other portions that are louder. To accommodate such variations in the media content, the sound level deviation application 704 can be programmed to delay a duration of time with the sound level below the threshold before determining a deviation in the sound level. For example, the sound level deviation application 704 can require that the sound level be below the threshold for a given duration (e.g., five seconds, ten seconds, 30 seconds, one minute, five minutes, etc.) before determining a determination is made as described further below.

A threshold is just one example way the sound level deviation application 704 could be programmed to determine when the sound level is such that modification of playback is desirable. Multiple thresholds could be used, or other techniques with different metrics could be used.

For example, the sound level deviation application 704 can also be programmed to vary the threshold or expected sound level based upon the actual expected sound level associated with the playback of the media content. For example, expected sound levels can be defined for various portions of media content, and the sound level deviation application 704 can be programmed to vary the expected sound level threshold based upon the portion of the media content currently being played back.

In such a scenario, the threshold can be lowered for portions of the media content that are softer and increased for portions that are louder. This can allow the sound level deviation application 704 to accommodate media content having varying sound levels. The sound level deviation application 704 therefore must determine the appropriate threshold given the current point of playback of the media content and then apply that threshold to the sound data from the sound level determination application 702.

In yet other instances, the sound level deviation application 704 can, in addition or alternatively, be programmed to look at the rate of change of the sound level. When the rate of change is substantial over a period of time, the sound level deviation application 704 is programmed to identify that change. For example, when the user U reduces the sound level of the playback of the media content significantly in less than one second, such behavior could indicate that the user is no longer listening, but is instead performing another task, such as talking.

The sound level deviation application 704 outputs a signal to the automatic mode application 706 when the sound level deviation application 704 determines that the user U is no longer listening to the playback of the media content. The automatic mode application 706 is programmed to pause or otherwise stop the playback of the media content by the PMSA system 110. As noted, the PMSA system 110 can also be programmed to save the location at which the media content is paused so that the user U can later resume playback of the media content at that location.

The automatic mode application 706 can also be programmed to perform other activities. For example, the automatic mode application 706 can be programmed to change the mode of the PSM system 110 to a lower power or standby mode. Other configurations are possible.

Referring now to FIG. 8, an example method 800 is shown for pausing playback of media content based upon a sound level of the playback of the media content within a vehicle.

At operation 810, a determination is made regarding the sound level of the playback of the media content. As noted, this determination can be made, for example, using one or more microphones positioned in the vehicle. Next, at operation 820, the sensed sound level of the playback of the media content is compared to an expected sound level.

For example, FIG. 9 illustrates additional details regarding one possible embodiment of such a comparison at operation 820. At operation 910, the expected volume threshold is determined. This determination can, as noted, simply be a preset threshold and/or a dynamic threshold that changes over time. Next, at operation 920, the sensed volume is compared to the expected volume threshold. Other configurations are possible.

Referring again to FIG. 8, based on the comparison at operation 820, a determination is made at operation 830 as to whether or not a deviation in the sound level has occurred. If so, the playback of the media content can automatically be paused at operation 840.

There can be various advantages associated with such a configuration. For example, automatically pausing the media content allows the user to resume listening at a later point without having to rewind or otherwise hunt for a desired playback location. Further, the automatic pausing of the content can avoid wasting power and bandwidth and reduce computational cost.

Where user data is used, it can be handled according to a defined user privacy policy and can be used to the extent allowed by the user. Where the data of other users is used, it can be handled in an anonymized matter so the user does not learn of the details of other users generally or specifically.

The various examples and teachings described above are provided by way of illustration only and should not be construed to limit the scope of the present disclosure. Those skilled in the art will readily recognize various modifications and changes that may be made without following the examples and applications illustrated and described herein, and without departing from the true spirit and scope of the present disclosure.

What is claimed is:

1. A method for playing media content with a media playback device in a vehicle, the method comprising:
   obtaining a sound measurement indicative of a sound level associated with playback of the media content by the media playback device in the vehicle;
   determining a rate of change of the sound level from an expected sound level associated with the playback of the media content based upon the sound measurement; and
   pausing playback of the media content using the media playback device when the rate of change of the sound level exceeds a threshold.

2. The method of claim 1, further comprising obtaining the sound measurement from one or more microphones positioned in the vehicle.

3. The method of claim 1, further comprising obtaining the sound measurement from one or more microphones associated with the media playback device.

4. The method of claim 1, further comprising:
   playing the media content using the media playback device in the vehicle; and
   determining the sound measurement that is indicative of a volume of the media content being played.

5. The method of claim 4, further comprising comparing the sound measurement to a playback sound level threshold.

6. The method of claim 1, further comprising:
   determining the expected sound level at a particular point in the playback of the media content; and
   comparing the expected sound level to the sound measurement at the particular point in the playback of the media content.

7. The method of claim 1, wherein pausing further comprises storing an elapsed playback time of the media content, and the method further comprising:
   receiving a user command to play the media content using the media playback device, after pausing; and
   resuming playback of the media content from the elapsed playback time.

8. The method of claim 1, wherein the sound measurement is obtained using a microphone arranged in the media playback device.

9. A system for playing media content with a media playback device in a vehicle, the system comprising:
   at least one processor; and
   memory encoding instructions that, when executed by the at least one processor, causes the at least one processor to:
      obtain a sound measurement indicative of a sound level associated with playback of the media content by the media playback device in the vehicle;
      determine a rate of change of the sound level from an expected sound level associated with the playback of the media content based upon the sound measurement; and
      pause playback of the media content using the media playback device when the rate of change of the sound level exceeds a threshold.

10. The system of claim 9, wherein the memory encodes further instructions that, when executed by the at least one processor, causes the at least one processor to obtain the sound measurement from one or more microphones positioned in the vehicle.

11. The system of claim 9, wherein the memory encodes further instructions that, when executed by the at least one processor, causes the at least one processor to obtain the sound measurement from one or more microphones associated with the media playback device.

12. The system of claim 9, wherein the memory encodes further instructions that, when executed by the at least one processor, causes the at least one processor to:
   play the media content using the media playback device in the vehicle; and
   determine the sound measurement that is indicative of a volume of the media content item being played.

* * * * *